US011152202B2

(12) United States Patent
Kudo et al.

(10) Patent No.: US 11,152,202 B2
(45) Date of Patent: Oct. 19, 2021

(54) TIME-OF-FLIGHT MASS SPECTROMETER

(71) Applicant: SHIMADZU CORPORATION, Kyoto (JP)

(72) Inventors: Tomoya Kudo, Kyoto (JP); Daisuke Okumura, Kyoto (JP)

(73) Assignee: SHIMADZU CORPORATION, Kyoto (JP)

(*) Notice: Subject to any disclaimer, the term of this patent is extended or adjusted under 35 U.S.C. 154(b) by 0 days.

(21) Appl. No.: 17/051,891

(22) PCT Filed: May 16, 2018

(86) PCT No.: PCT/JP2018/018853
§ 371 (c)(1),
(2) Date: Oct. 30, 2020

(87) PCT Pub. No.: WO2019/220554
PCT Pub. Date: Nov. 21, 2019

(65) Prior Publication Data
US 2021/0125819 A1   Apr. 29, 2021

(51) Int. Cl.
*H01J 49/40*       (2006.01)
*H01J 37/16*       (2006.01)
*H01J 37/09*       (2006.01)

(52) U.S. Cl.
CPC ............ *H01J 49/401* (2013.01); *H01J 37/09* (2013.01); *H01J 37/165* (2013.01); *H01J 49/403* (2013.01)

(58) Field of Classification Search
CPC ........ H01J 49/401; H01J 49/403; H01J 37/09; H01J 37/165
USPC ....................................................... 250/287
See application file for complete search history.

(56) References Cited

U.S. PATENT DOCUMENTS

2011/0095175 A1* 4/2011 Bateman .............. G01N 27/624
                                                          250/282
2015/0060656 A1* 3/2015 Ugarov ................. H01J 49/061
                                                          250/282
2017/0278691 A1  9/2017 Okumura

FOREIGN PATENT DOCUMENTS

JP           6202214 B2     9/2017

OTHER PUBLICATIONS

International search report for PCT/JP2018/018853 dated Aug. 21, 2018.
Written opinion for PCT/JP2018/018853 dated Aug. 21, 2018.

* cited by examiner

*Primary Examiner* — Kiet T Nguyen
(74) *Attorney, Agent, or Firm* — Sughrue Mion, PLLC

(57) ABSTRACT

A transfer electrode unit (240) is configured by coaxially arranging a plurality of loop electrodes (241A, 241B, 241C), and guides ions to an orthogonal acceleration region (242C) by allowing the ions to pass through an inner side of the plurality of electrodes (241A, 241B, 241C) each of which is applied with a voltage. A voltage having a higher absolute value than the voltage applied to the plurality of electrodes (241A, 241B, 241C) is applied to a flight tube (246), and the ions accelerated in the orthogonal acceleration region (242C) are introduced to a flight space formed in the flight tube (246). A shield portion (241F) is provided between the transfer electrode unit (240) and the flight tube (246), and suppresses that an electric field derived from the voltage applied to the flight tube (246) enters the transfer electrode unit (240).

3 Claims, 5 Drawing Sheets

TIME-OF-FLIGHT MASS SPECTROMETER

CROSS-REFERENCE TO RELATED APPLICATIONS

This application is a National Stage of International Application No. PCT/JP2018/018853 filed May 16, 2018.

TECHNICAL FIELD

The present invention relates to an orthogonal acceleration time-of-flight mass spectrometer which accelerates ions incident on an orthogonal acceleration region in a direction orthogonal to an incident direction of the ions, guides the accelerated ions into a flight space, and analyzes mass-to-charge ratios of the ions on the basis of the time of flight of the ion in the flight space.

BACKGROUND ART

As a time-of-flight mass spectrometer (TOFMS), one that accelerates ions by an orthogonal acceleration method has been known (for example, refer to Patent Document 1). This type of time-of-flight mass spectrometer includes a transfer electrode unit, an orthogonal acceleration unit, a flight tube, and the like.

The transfer electrode unit is configured by coaxially arranging a plurality of loop electrodes. By applying a voltage to each of these electrodes, an electric field is formed on an inner side of each electrode, and the ions are guided to the orthogonal acceleration unit through the electric field. An orthogonal acceleration region where the ions incident from the transfer electrode unit are accelerated in a direction orthogonal to the incident direction of the ions is formed in the orthogonal acceleration unit.

The ions accelerated in the orthogonal acceleration region are guided to the flight space in the flight tube, fly in the flight space, and then are detected by a detector. As a result, the time of flight of the ion until the ion reaches the detector is measured, and the mass-to-charge ratio m/z of the ion is calculated on the basis of the time of flight.

PRIOR ART DOCUMENTS

Patent Documents

Patent Document 1: Japanese Patent No. 6202214

SUMMARY OF THE INVENTION

Problems to be Solved by the Invention

A voltage of, for example, about several tens of volts is applied to each of electrodes constituting the transfer electrode unit. On the other hand, a high voltage of about 7 kV is applied to the flight tube. In general, the polarity of the voltage applied to the flight tube differs depending on the polarity of the ion to be detected, and a voltage of −7 kV is applied at the time of detecting positive ions, and a voltage of +7 kV is applied at the time of detecting negative ions. In either case, a high voltage of which the absolute value is, for example, 10 times or more than the voltage applied to at least a part of the electrodes constituting the transfer electrode unit is applied to the flight tube. In the orthogonal acceleration time-of-flight mass spectrometer, since the transfer electrode unit and the flight tube are located relatively close to each other, the electric field derived from the high voltage applied to the flight tube enters the transfer electrode unit to cause fluctuation in the electric field in the transfer electrode unit, which is a problem.

In a case where the electric field fluctuates in the transfer electrode unit as described above, the ions passing through the transfer electrode unit are bent, resulting in a decrease in resolution, a decrease in sensitivity, a decrease in measurement accuracy, and the like. It is considered to reduce the distance between the electrodes in order to reduce the entrance of the electric field into the transfer electrode unit, but the number of electrodes is increased to cause an increase in manufacturing costs, and the component tolerances are accumulated to cause deterioration of the measurement accuracy.

The invention has been made in view of the above circumstances, and an object thereof is to provide a time-of-flight mass spectrometer which can prevent the fluctuation in the electric field in the transfer electrode unit due to the voltage applied to the flight tube.

Means for Solving the Problems (1) A time-of-flight mass spectrometer according to the invention is an orthogonal acceleration time-of-flight mass spectrometer which accelerates ions incident on an orthogonal acceleration region in a direction orthogonal to an incident direction of the ions, guides the accelerated ions into a flight space, and analyzes a mass-to-charge ratio of each of the ions on the basis of time of flight of the ion in the flight space, and includes a transfer electrode unit, a flight tube, and a shield portion. The transfer electrode unit is configured by coaxially arranging a plurality of loop electrodes, and guides the ions to an orthogonal acceleration region by allowing the ions to pass through an inner side of the plurality of electrodes each of which is applied with a voltage. A voltage having a higher absolute value than the voltage applied to the plurality of electrodes is applied to the flight tube, and the ions accelerated in the orthogonal acceleration region are introduced to the flight space formed in the flight tube. A shield portion is provided between the transfer electrode unit and the flight tube, and suppresses that an electric field derived from the voltage applied to the flight tube enters the transfer electrode unit.

With such a configuration, by the shield portion provided between the transfer electrode unit and the flight tube, it is possible to suppress that the electric field derived from the voltage applied to the flight tube enters the transfer electrode unit. As a result, it is possible to prevent the fluctuation in the electric field in the transfer electrode unit due to the voltage applied to the flight tube.

(2) The shield portion may be formed by a part of the plurality of electrodes.

With such a configuration, the shield portion can be formed by using a part of the plurality of electrodes constituting the transfer electrode unit. Accordingly, it is not necessary to provide the shield portion as a separate member, and thus the manufacturing cost can be reduced.

(3) The time-of-flight mass spectrometer may further include a vacuum chamber. In the vacuum chamber, a vacuum vessel that becomes in a vacuum state during analysis is formed, and the flight tube and at least one electrode of the plurality of electrodes are provided in the vacuum vessel. In this case, the shield portion may be provided between the at least one electrode and the flight tube.

With such a configuration, between the flight tube and at least one electrode provided in the same vacuum vessel, by the shield portion, it is possible to suppress that the electric field derived from the voltage applied to the flight tube enters the transfer electrode unit.

Effects of the Invention

According to the invention, since it is possible to suppress that the electric field derived from the voltage applied to the flight tube enters the transfer electrode unit, it is possible to prevent the fluctuation in the electric field in the transfer electrode unit due to the voltage applied to the flight tube.

MODE FOR CARRYING OUT THE INVENTION

1. Overall Configuration of Liquid Chromatograph Mass Spectrometer

Figure 1:
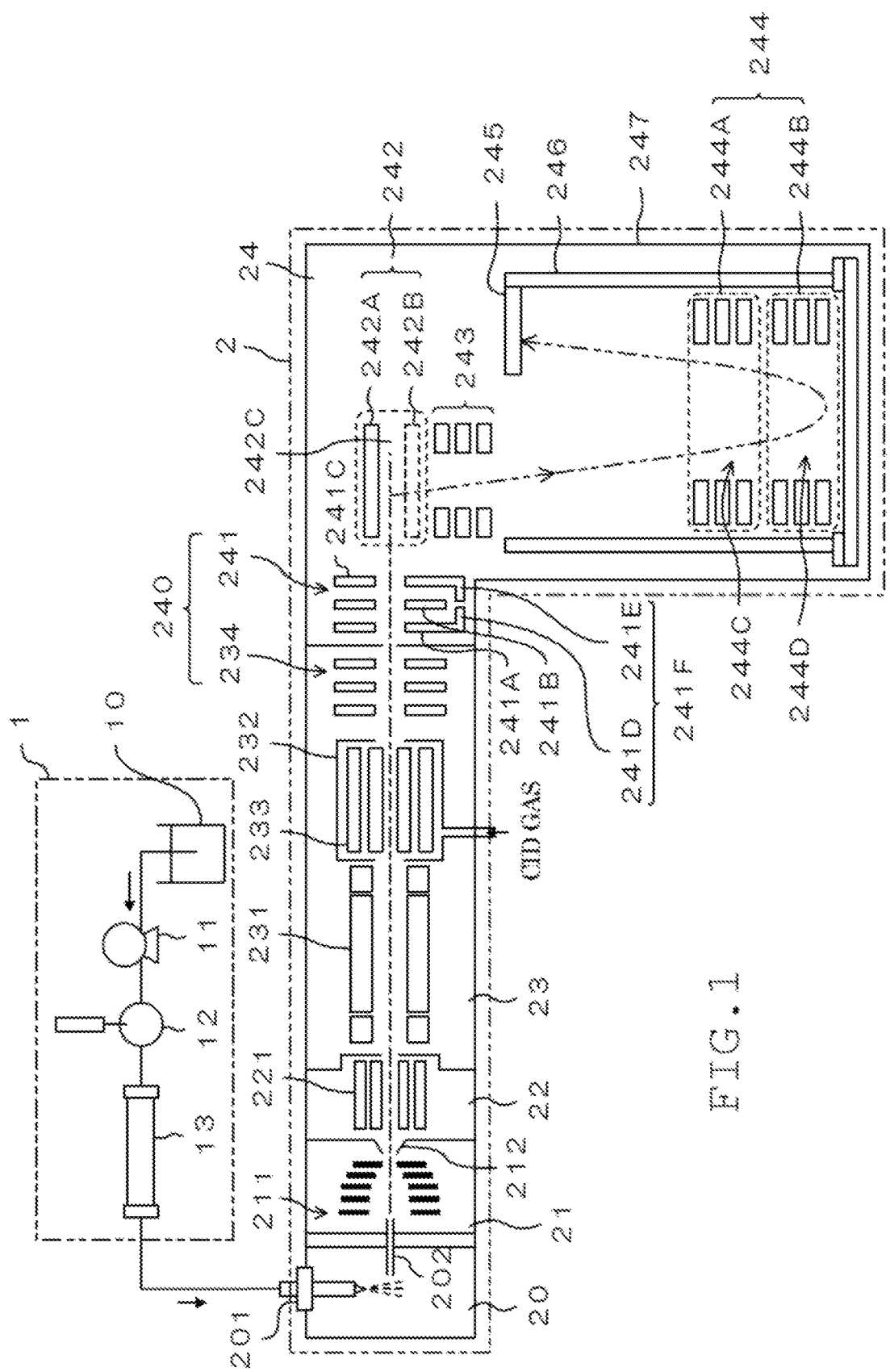
FIG. 1 is a schematic diagram illustrating a configuration example of a liquid chromatograph mass spectrometer including a time-of-flight mass spectrometer according to an embodiment of the invention.

FIG. 1 is a schematic diagram illustrating a configuration example of a liquid chromatograph mass spectrometer including a time-of-flight mass spectrometer according to an embodiment of the invention. The liquid chromatograph mass spectrometer includes a liquid chromatograph unit 1 and a mass spectrometer unit 2.

The liquid chromatograph unit 1 includes a mobile phase container 10, a pump 11, an injector 12, a column 13, and the like. A mobile phase is stored in the mobile phase container 10. The pump 11 sends out the mobile phase in the mobile phase container 10 to the injector 12. In the injector 12, a predetermined amount of sample is injected into the mobile phase from the mobile phase container 10. The mobile phase into which the sample is injected is introduced into the column 13, and respective components in the sample are separated in the course of passing through the column 13. The respective components in the sample separated by the column 13 are sequentially supplied to the mass spectrometer unit 2.

The mass spectrometer unit 2 is configured by a time-of-flight mass spectrometer (TOFMS), and an ionization chamber 20, a first intermediate chamber 21, a second intermediate chamber 22, a third intermediate chamber 23, an analysis chamber 24, and the like are formed inside the mass spectrometer unit 2. The inside of the ionization chamber 20 is substantially at atmospheric pressure. Each of the first intermediate chamber 21, the second intermediate chamber 22, the third intermediate chamber 23, and the analysis chamber 24 is brought into a vacuum state (negative pressure state) by driving a vacuum pump (not illustrated). The ionization chamber 20, the first intermediate chamber 21, the second intermediate chamber 22, the third intermediate chamber 23, and the analysis chamber 24 communicate with each other, and are configured such that the degree of vacuum is gradually increased in this order.

The ionization chamber 20 is provided with a spray 201 such as an electro spray ionization (ESI) spray. A sample liquid containing respective components in the sample supplied from the liquid chromatograph unit 1 is sprayed into the ionization chamber 20 by the spray 201 while being charged. As a result, ions derived from the respective components in the sample are generated. However, the ionization method used in the mass spectrometer unit 2 is not limited to the ESI, and other ionization methods such as atmospheric pressure chemical ionization (APCI) or probe electro spray ionization (PEST) may be used.

The first intermediate chamber 21 communicates with the ionization chamber 20 via a heating capillary 202 composed of a small-diameter tube. Further, the second intermediate chamber 22 communicates with the first intermediate chamber 21 via a skimmer 212 composed of a small hole. The first intermediate chamber 21 and the second intermediate chamber 22 are respectively provided with ion guides 211 and 221 each of which is for focusing the ions and sending the ions to the subsequent stage.

The third intermediate chamber 23 is provided with, for example, a quadrupole mass filter 231 and a collision cell 232. A collision induced dissociation (CID) gas such as argon or nitrogen is continuously or intermittently supplied to the inside of the collision cell 232. A multipole ion guide 233 is provided in the collision cell 232.

The ions flowing from the second intermediate chamber 22 to the third intermediate chamber 23 are separated by the quadrupole mass filter 231 according to the mass-to-charge ratio, and only the ions having a specific mass-to-charge ratio pass through the quadrupole mass filter 231. The ions that have passed through the quadrupole mass filter 231 are introduced into the collision cell 232 as precursor ions, and are brought into contact with the CID gas to be cleaved to generate product ions. The generated product ions are temporarily held by the multipole ion guide 233, and emitted from the collision cell 232 at a predetermined timing.

A transfer electrode unit 240 is provided in the third intermediate chamber 23 and the analysis chamber 24 so as to straddle the chambers. The transfer electrode unit 240 includes one or a plurality of first electrodes 234 provided in the third intermediate chamber 23 and one or a plurality of second electrodes 241 provided in the analysis chamber 24. The first electrode 234 and the second electrode 241 are each formed in a loop shape and are coaxially arranged. The ions (product ions) emitted from the collision cell 232 are focused by passing through the inner side of the plurality of electrodes 234 and 241 in the transfer electrode unit 240.

In addition to the second electrode 241, an orthogonal acceleration unit 242, an acceleration electrode unit 243, a reflectron 244, a detector 245, a flight tube 246, and the like are provided in the analysis chamber 24. The flight tube 246 is, for example, a hollow member of which both ends are open, and the reflectron 244 is arranged inside the flight tube 246.

The ions enter the orthogonal acceleration unit 242 from the transfer electrode unit 240. The orthogonal acceleration unit 242 includes a pair of electrodes 242A and 242B facing each other with a space therebetween. The pair of electrodes 242A and 242B extends parallel to an incident direction of the ions from the transfer electrode unit 240, and an orthogonal acceleration region 242C is formed between the electrodes 242A and 242B.

One electrode 242B is configured by a grid electrode having a plurality of openings. The ions that enter the orthogonal acceleration region 242C are accelerated in a direction orthogonal to the incident direction of the ions, pass through the openings of the one electrode 242B, and are guided to the acceleration electrode unit 243. In the present embodiment, the orthogonal acceleration unit 242 constitutes an ion emission unit that emits ions to be analyzed. The ions emitted from the orthogonal acceleration unit 242 are further accelerated by the acceleration electrode unit 243, and are introduced into the flight tube 246. A voltage of which the absolute value is higher than the voltage applied to each of the electrodes 234 and 241 of the transfer electrode unit 240 is applied to the flight tube 246.

The reflectron 244 provided in the flight tube 246 includes one or a plurality of first electrodes 244A and one or a plurality of second electrodes 244B. The first electrode 244A and the second electrode 244B are each formed in a loop shape and are coaxially arranged along the axis of the flight tube 246. Different voltages are applied to the first electrode 244A and the second electrode 244B, respectively.

The ions introduced into the flight tube 246 are guided into a flight space formed in the flight tube 246, fly into the flight space, and then enter the detector 245. Specifically, the ions introduced into the flight tube 246 are turned in a U shape to enter the detector 245 by being decelerated in a first region (first stage) 244C formed on the inner side of the first electrode 244A and then being reflected in a second region (second stage) 244D formed on the inner side of the second electrode 244B.

The time of flight from when the ion is emitted from the orthogonal acceleration unit 242 to when the ion enters the detector 245 depends on the mass-to-charge ratio of the ion. Therefore, the mass-to-charge ratio of each ion can be calculated based on the time of flight of each ion emitted from the orthogonal acceleration unit 242, and the mass spectrum can be created.

2. Specific Configuration of Transfer Electrode Unit

The transfer electrode unit 240 in the present embodiment includes three second electrodes 241 (electrodes 241A, 241B, and 241C) on the analysis chamber 24 side. The analysis chamber 24 constitutes a vacuum vessel that becomes in a vacuum state during analysis, and the electrodes 241A, 241B, and 241C and the flight tube 246 are provided in the vacuum vessel. The vacuum vessel (analysis chamber 24) is formed in a vacuum chamber 247.

Among the three electrodes 241A, 241B, and 241C which are coaxially arranged, two electrodes 241A and 241C on both sides of the central electrode 241B are partially bent or curved.

Specifically, an end portion of the electrode 241A on the flight tube 246 side is bent in an L shape toward the electrode 241B, thereby forming a protruding piece 241D. A tip end of the protruding piece 241D is located in the vicinity of an end portion of the electrode 241B on the flight tube 246 side, but is separated so as not to be in contact with the electrode 241B.

Further, an end portion of the electrode 241C on the flight tube 246 side is bent in an L shape toward the electrode 241B, thereby forming a protruding piece 241E. A tip end of the protruding piece 241E is located in the vicinity of the end portion of the electrode 241B on the flight tube 246 side and in the vicinity of the end portion of the protruding piece 241D, but is separated so as not to be in contact with the electrodes 241A and 241B.

In this manner, the electrodes 241A 241B, and 241C are close to each other on the flight tube 246 side, but are separated from each other to an extent that no discharge occurs between the electrodes. The protruding pieces 241D and 241E extend in the same straight line, and are arranged so as to block between the central electrode 241 and the flight tube 246.

The protruding pieces 241D and 241E arranged as described above constitute a shield portion 241F for suppressing that the electric field derived from the voltage applied to the flight tube 246 enters the transfer electrode unit 240. That is, an electric field reaching the transfer electrode unit 240 is formed in the vicinity of the flight tube 246 to which a voltage of which the absolute value is higher than the voltage applied to each of the electrodes 234 and 241 of the transfer electrode unit 240 is applied. By blocking this electric field with the shield portion 241F, the electric field does not enter an ion passage region in the transfer electrode unit 240.

In the present embodiment, the shield portion 241F is integrally formed with the transfer electrode unit 240, so that the shield portion 241F is provided between the transfer electrode unit 240 (electrodes 241A, 241B, and 241C) and the flight tube 246.

3. Effects (1) In the present embodiment, by the shield portion 241F provided between the transfer electrode unit 240 and the flight tube 246, it is possible to suppress that the electric field derived from the voltage applied to the flight tube 246 enters the transfer electrode unit 240. As a result, it is possible to prevent the fluctuation in the electric field in the transfer electrode unit 240 due to the voltage applied to the flight tube 246.

(2) Further, in the present embodiment, the shield portion 241F can be formed by using a part of the plurality of electrodes 241A, 241B, and 241C constituting the transfer electrode unit 240. Accordingly, it is not necessary to provide the shield portion 241F as a separate member, and thus the manufacturing cost can be reduced.

(3) Particularly, in the present embodiment, between the flight tube 246 and at least one of the electrodes 241A, 241B, and 241C provided in the same vacuum vessel (in the analysis chamber 24), by the shield portion 241F, it is possible to suppress that the electric field derived from the voltage applied to the flight tube 246 enters the transfer electrode unit 240.

4. First Modification Example

Figure 2A:
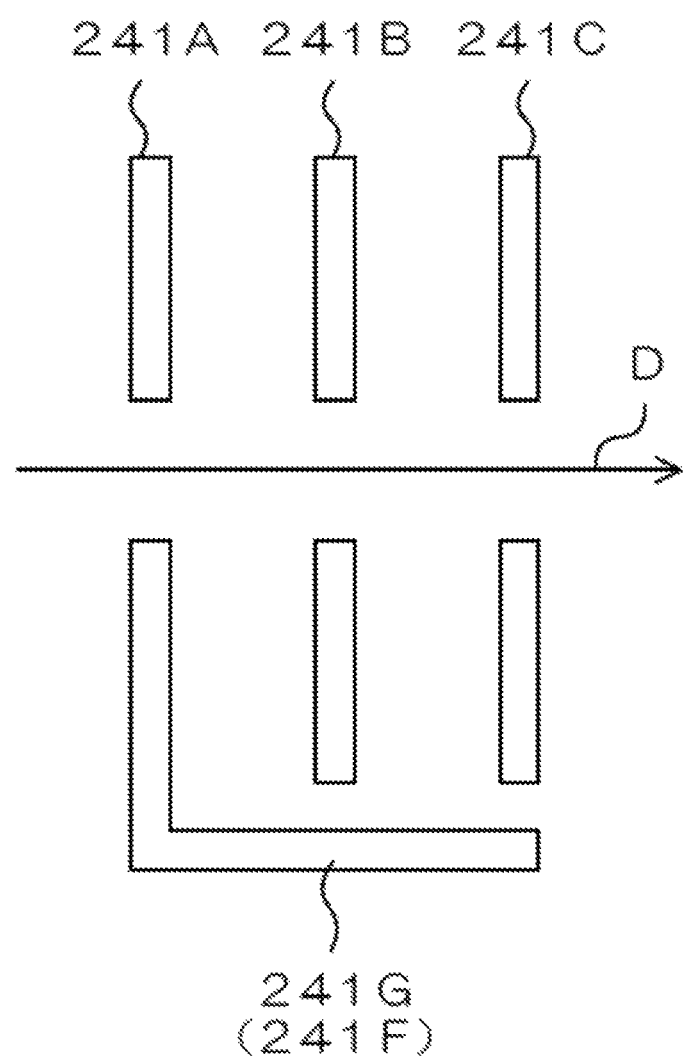
FIG. 2A is a schematic diagram illustrating a first modification example of a second electrode portion of a transfer electrode unit.

FIG. 2A is a schematic diagram illustrating a first modification example of the second electrodes 241 of the transfer electrode unit 240. In the first modification example, among the three second electrodes 241 (electrodes 241A, 241B, and 241C) provided on the analysis chamber 24 side, only the electrode 241A which is on the most upstream side in an ion passage direction D is bent or curved.

Specifically, an end portion of the electrode 241A on the flight tube 246 side is bent in an L shape toward the electrode 241B, thereby forming a protruding piece 241G. A tip end of the protruding piece 241G is located in the vicinity of the end portion of the electrode 241C on the flight tube 246 side, but is separated so as not to be in contact with the electrodes 241B and 241C. The protruding piece 241G arranged as described above constitutes the shield portion 241F for suppressing that the electric field derived from the voltage applied to the flight tube 246 enters the transfer electrode unit 240.

5. Second Modification Example

Figure 2B:
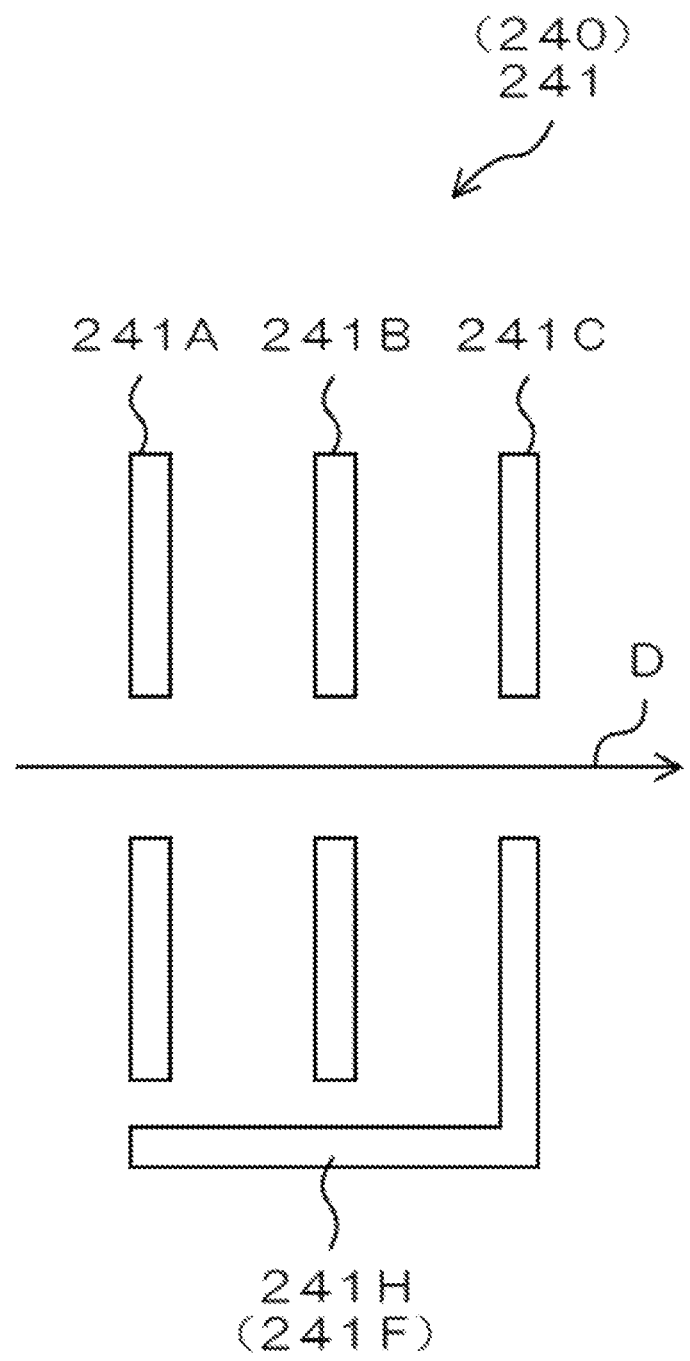
FIG. 2B is a schematic diagram illustrating a second modification example of the second electrode portion of the transfer electrode unit.

FIG. 2B is a schematic diagram illustrating a second modification example of the second electrodes 241 of the transfer electrode unit 240. In the second modification example, among the three second electrodes 241 (electrodes 241A, 241B, and 241C) provided on the analysis chamber 24 side, only the electrode 241C which is on the most downstream side in the ion passage direction D is bent or curved.

Specifically, an end portion of the electrode 241C on the flight tube 246 side is bent in an L shape toward the electrode 241B, thereby forming a protruding piece 241H. A tip end of the protruding piece 241H is located in the vicinity of the end portion of the electrode 241A on the flight tube 246 side, but is separated so as not to be in contact with the electrodes 241A and 241B. The protruding piece 241H arranged as described above constitutes the shield portion 241F for suppressing that the electric field derived from the voltage applied to the flight tube 246 enters the transfer electrode unit 240.

6. Third Modification Example

Figure 2C:
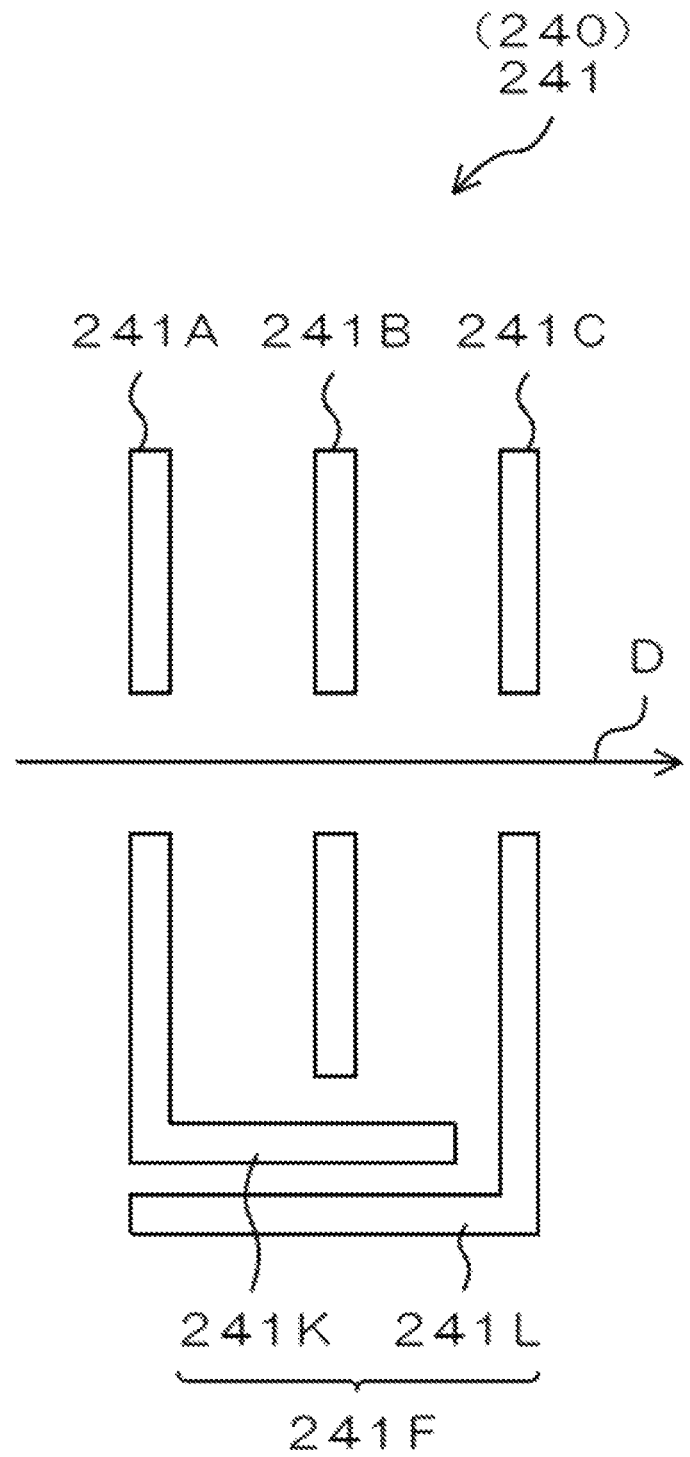
FIG. 2C is a schematic diagram illustrating a third modification example of the second electrode portion of the transfer electrode unit.

FIG. 2C is a schematic diagram illustrating a third modification example of the second electrodes 241 of the transfer electrode unit 240. In the third modification example, among the three second electrodes 241 (electrodes 241A, 241B, and 241C) provided on the analysis chamber 24 side, the electrode 241A which is on the most upstream side in the ion passage direction D and the electrode 241C which is on the most downstream side in the ion passage direction D are bent or curved.

Specifically, an end portion of the electrode 241A on the flight tube 246 side is bent in an L shape toward the electrode 241B, thereby forming a protruding piece 241K. A tip end of the protruding piece 241K is located in the vicinity of the end portion of the electrode 241C, but is separated so as not to be in contact with the electrodes 241B and 241C.

Further, an end portion of the electrode 241C on the flight tube 246 side is bent in an L shape toward the electrode 241B, thereby forming a protruding piece 241L. The protruding piece 241L extends in parallel to the protruding piece 241K, and is separated so as not to be in contact with the protruding piece 241K.

The protruding pieces 241K and 241L arranged as described above constitute the shield portion 241F for suppressing that the electric field derived from the voltage applied to the flight tube 246 enters the transfer electrode unit 240. Since the plurality of protruding pieces 241K and 241L are arranged side by side in an entrance direction of the electric field from the flight tube 246 side, it is possible to effectively suppress the entrance of the electric field to the transfer electrode unit 240.

7. Fourth Modification Example

Figure 2D:
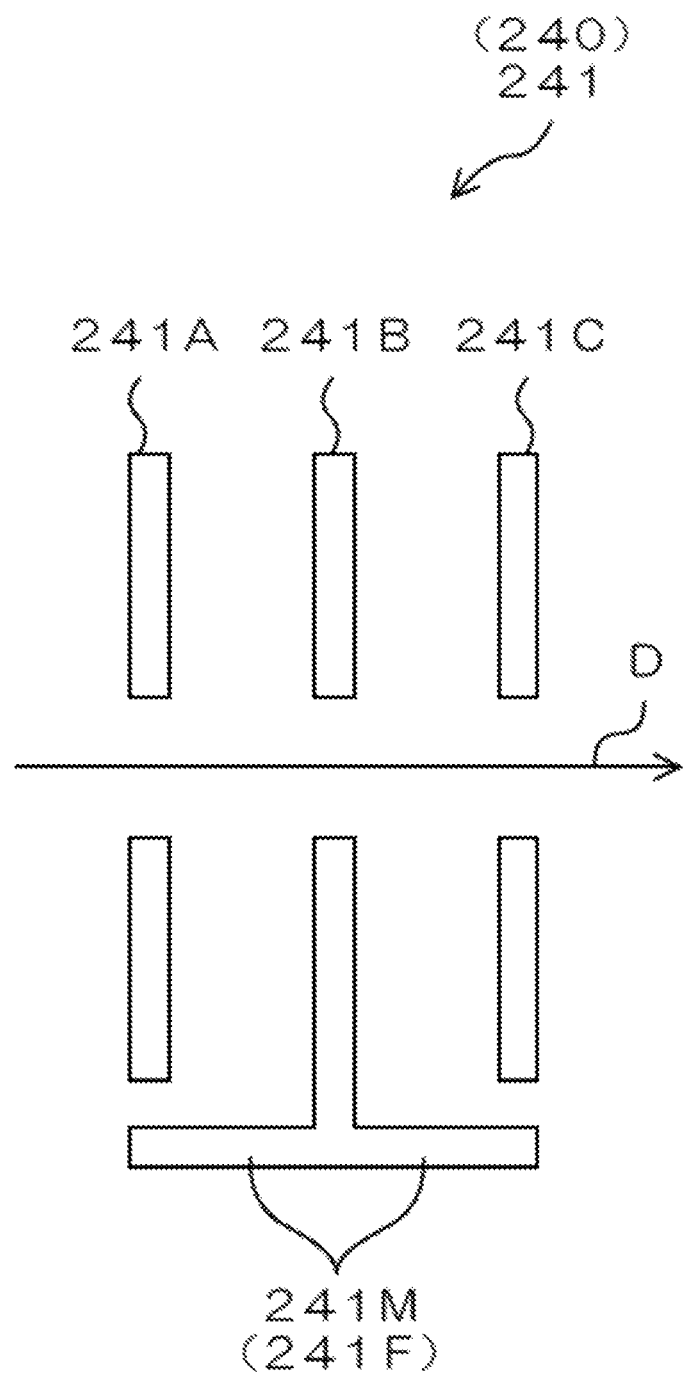
FIG. 2D is a schematic diagram illustrating a fourth modification example of the second electrode portion of the transfer electrode unit.

FIG. 2D is a schematic diagram illustrating a fourth modification example of the second electrodes 241 of the transfer electrode unit 240. In the fourth modification example, among the three second electrodes 241 (electrodes 241A, 241B, and 241C) provided on the analysis chamber 24 side, only the central electrode 241B in the ion passage direction D is bent or curved.

Specifically, the electrode 241B is formed in a T shape by forming protruding pieces 241M, which respectively protrude toward the electrode 241A side and the electrode 241C side, on the end portion of the electrode 241B on the flight tube 246 side. A tip end of one protruding piece 241M is located in the vicinity of the end portion of the electrode 241A on the flight tube 246 side, and a tip end of the other protruding piece 241M is located in the vicinity of the end portion of the electrode 241C on the flight tube 246 side, but the protruding pieces 241M are separated so as not to be in contact with the electrodes 241A and 241C. The protruding pieces 241M arranged as described above constitute the shield portion 241F for suppressing that the electric field derived from the voltage applied to the flight tube 246 enters the transfer electrode unit 240.

8. Other Modification Example

The number of electrodes (second electrodes 241) that the transfer electrode unit 240 includes on the analysis chamber 24 side is not limited to three, and may be two or four or more. In a case where two second electrodes 241 are provided, one of the second electrodes 241 may constitute the shield portion 241F. Further, in a case where four or more second electrodes 241 are provided, two second electrodes 241 arranged at both ends may constitute the shield portion 241F, or any one or a plurality of the second electrodes 241 may constitute the shield portion 241F.

Without being limited to the configuration in which the shield portion 241F is integrally formed with the transfer electrode unit 240, a shield portion may be provided as a separate member between the transfer electrode unit 240 and the flight tube 246. In this case, the shield portion may be, for example, a plate-shaped member provided between the transfer electrode unit 240 and the flight tube 246, or may be a cylindrical member that covers the periphery of the transfer electrode unit 240.

The transfer electrode unit 240 is not limited to the configuration of being provided so as to straddle the third intermediate chamber 23 and the analysis chamber 24, and the transfer electrode unit 240 (second electrodes 241) may be provided only in the analysis chamber 24.

The time-of-flight mass spectrometer according to the invention is not limited to the one configured as a liquid chromatograph mass spectrometer by being connected to the liquid chromatograph unit 1, and may be configured so as not to be connected to the liquid chromatograph unit 1 such as a configuration using, for example, matrix assisted laser desorption/ionization (MALDI).

DESCRIPTION OF REFERENCE SIGNS 1 liquid chromatograph unit
2 mass spectrometer unit
234 first electrode
240 transfer electrode unit
241 second electrode
241A-241C electrode
241D, 241E protruding piece
241F shield portion
241G-241M protruding piece
242 orthogonal acceleration unit
242C orthogonal acceleration region
244 reflectron
246 flight tube
247 vacuum chamber

The invention claimed is:

1. An orthogonal acceleration time-of-flight mass spectrometer which accelerates ions incident on an orthogonal acceleration region in a direction orthogonal to an incident direction of the ions, guides the accelerated ions into a flight space, and analyzes a mass-to-charge ratio of each of the ions on the basis of time of flight of the ion in the flight space, the time-of-flight mass spectrometer comprising:
   a transfer electrode unit which is configured by coaxially arranging a plurality of loop electrodes, and guides the ions to the orthogonal acceleration region by allowing the ions to pass through an inner side of the plurality of electrodes each of which is applied with a voltage;
   a flight tube to which a voltage having a higher absolute value than the voltage applied to the plurality of electrodes is applied, and in which the flight space to which the ions accelerated in the orthogonal acceleration region are introduced is formed; and a shield portion which is provided between the transfer electrode unit and the flight tube, and suppresses that an electric field derived from the voltage applied to the flight tube enters the transfer electrode unit.

2. The time-of-flight mass spectrometer according to claim 1, wherein the shield portion is formed by a part of the plurality of electrodes.

3. The time-of-flight mass spectrometer according to claim 1, further comprising:

a vacuum chamber in which a vacuum vessel that becomes in a vacuum state during analysis is formed, and in which the flight tube and at least one electrode of the plurality of electrodes are provided in the vacuum vessel, wherein the shield portion is provided between the at least one electrode and the flight tube.

* * * * *